United States Patent [19]
Schroeder

[11] Patent Number: 5,347,091
[45] Date of Patent: Sep. 13, 1994

[54] MULTILAYER CIRCUIT CARD CONNECTOR

[75] Inventor: Donald R. Schroeder, Lafayette, Ind.

[73] Assignee: CTS Corporation, Elkhart, Ind.

[21] Appl. No.: 933,424

[22] Filed: Aug. 21, 1992

[51] Int. Cl.$^5$ .............................................. H05K 1/00
[52] U.S. Cl. .................................. 174/262; 174/252; 361/785
[58] Field of Search ............... 174/262, 250, 252, 263, 174/264, 266; 361/399, 400, 408, 412, 414, 415, 784, 785, 796; 228/180.1, 179

[56] References Cited

U.S. PATENT DOCUMENTS 4,882,454 11/1989 Peterson et al. .
4,885,126 12/1989 Polonio .
5,111,003 5/1992 Kimbara .
5,183,972 2/1993 Duane et al. .

Primary Examiner—Leo P. Picard
Assistant Examiner—Cheryl R. Figlin
Attorney, Agent, or Firm—Albert W. Watkins

[57] ABSTRACT

A multilayer circuit card is disclosed that interconnects multichip modules to each other electrically, and simultaneously acts to dissipate otherwise destructive thermal energy. The circuit card is comprised by an aluminum nitride core and two opposed low temperature co-fired ceramic laminates, all three laminated to each other.

6 Claims, 2 Drawing Sheets

MULTILAYER CIRCUIT CARD CONNECTOR

BACKGROUND OF THE INVENTION

1. Field of the Invention

This invention pertains generally to electrical connectors and specifically to interconnects between highly complex multichip modules that are densely loaded with thermally dissipative semiconductor dice.

2. Description of the Related Art

Prior to the present invention, modules were typically interconnected using a flexible film type connector. These connectors use a polymer film or tape, typically of a material such as Kapton, as a compliant carrier for metallizations. The metallizations serve as electrical connectors that may be soldered or otherwise interconnected to the connection sites on the modules.

During the operation of a multichip module, there may be substantial thermal energy dissipated through the exterior of the package. This thermal energy is often the source for localized heating that leads to thermally induced expansion. When a component such as the module expands from internal heating, another structure, even if of matched thermal expansion coefficient, will not expand in a matching way. If a rigid material such as glass or alumina is incorporated as a connector, the electrical connections and possibly the connector and the device are prone to failure.

The use of a polymer material is necessitated by the need for a carrier that will deform when forces are applied. This deformation serves to protect the module, connector, and solder joints from thermal stress induced failures. Polymers such as Kapton are particularly prevalent for these types of connectors because of good thermal and chemical resistance and availability.

However, polymer materials do not possess good thermal conductivity. In fact, they are the worst thermal conductors available. Unfortunately then, the use of a flexible connector results in a sacrifice of thermal dissipation which will accelerate the failure of the circuitry contained within the multichip module.

In order to provide adequate cooling for the modules, other structures have been proposed. On such structure utilizes metal pins placed in a grid pattern to interconnect the devices. An electrically non-conductive fluid such as air or Freon may then be circulated between the modules to provide enhanced cooling.

Unfortunately, the use of metal pins requires complex assembly and production, resulting in greater cost. Bent pins result during production, further affecting the final cost. Additionally, since the metal pins require a certain amount of length to yield sufficiently, space is sacrificed.

In summary, to date there has not been an adequate solution to the interconnection of multichip modules that addresses thermal dissipation, expansion, cooling, environmental resistance including resistance to chemical attack, and package durability.

SUMMARY OF THE INVENTION

The present invention overcomes the limitations of the prior art by laminating about an aluminum nitride core Low Temperature Cofired Ceramic sheets (LTCC). These sheets are patterned as required to form the desired interconnections and thermal vias and are then laminated to the aluminum nitride core. The aluminum nitride core additionally has electrical vias formed through from one surface to the other, to interconnect the opposing layers of LTCC. In this way, an interconnect is formed with sufficient thermal conductivity and nearly matched thermal coefficients of expansion. Upon heating, which is minimized by the excellent thermal conductivity of the aluminum nitride core, the multichip modules and multilayer circuit card expand and contract without the generation of destructive forces.

BRIEF DESCRIPTION OF THE DRAWINGS

FIG. 1 illustrates a side view of the preferred embodiment, while

DESCRIPTION OF THE PREFERRED EMBODIMENT

Figure 1:
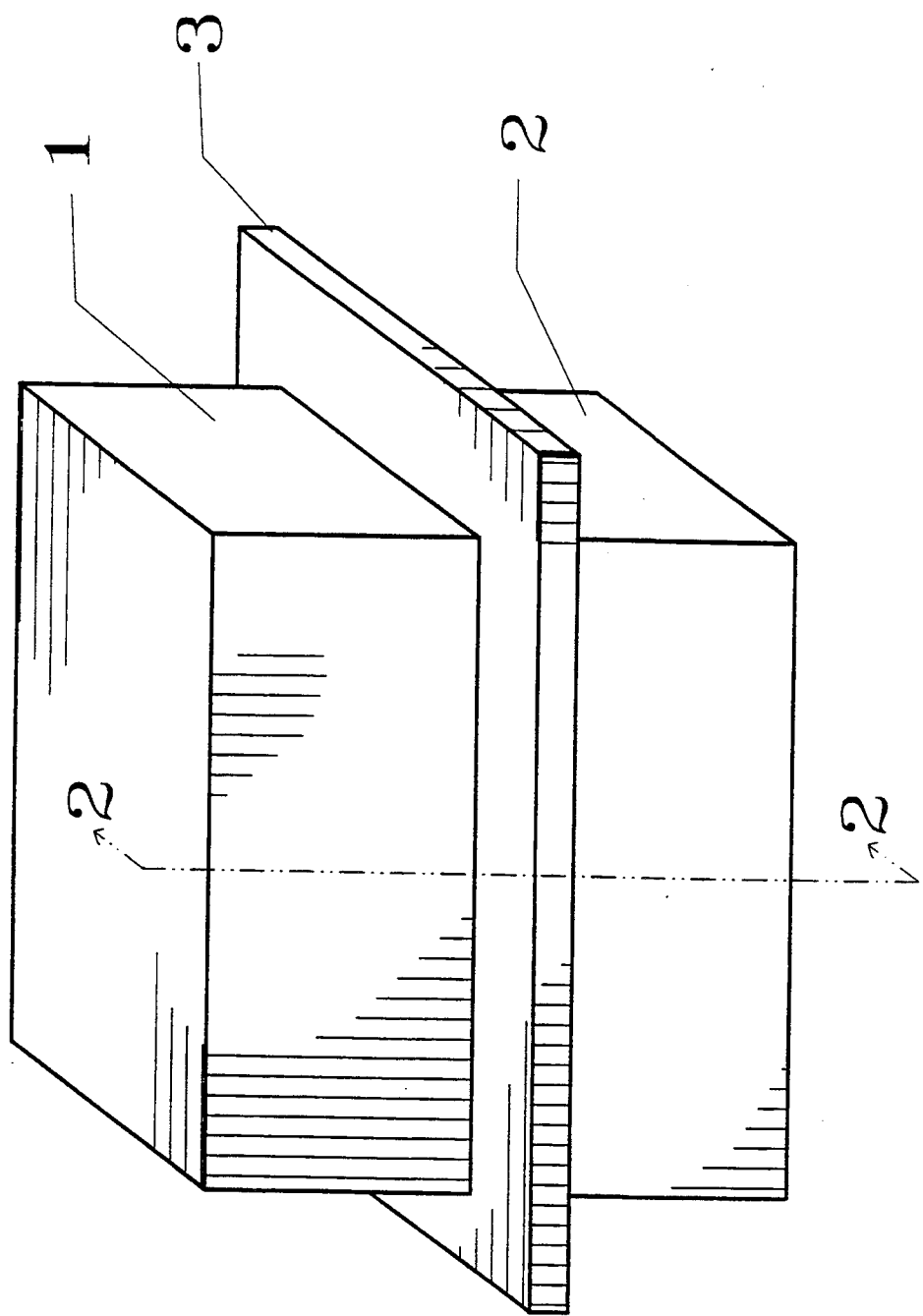

FIG. 1 illustrates an exemplary embodiment showing application of the multilayer circuit card 3. Multichip modules 1 and 2 are packages that comprise a number of electrical and electronic components therein.

With the complexity of electronics ever increasing, there is a need for greater integration of function. Multichip modules fill that need. These modules may include a large number of circuits for performing a task, yet upon packaging and final test, they are treated and may be viewed as behaving as a single device. Reliability and repairability are both thereby improved greatly, which is essential with the increased complexity. Final packaging is also simplified, since assembly of a large number of components is not required. While cost is still an issue, the ability to assemble a large number of unpackaged components together into a single package is advantageous to overall price of a module.

For the purposes of this invention these modules are illustrated as "black boxes" with only external electrical connection sites, though it is understood that were one to open these "boxes," there would be much contained inside. These modules 1 and 2 are interconnected through a multilayer circuit card 3 which performs several functions. The card 3 routes signals form one module to another, sometimes overlapping and crisscrossing the interconnections. This is accomplished while still maintaining isolation between the signals.

Card 3 also provides a pathway for thermal dissipation of energy from the modules 1 and 2. This may be accomplished by the inclusion of heat sinks affixed to the core of card 3 or through the use of special cooling mediums circulated past card 3. Since card 3 is in direct electrical and thermal contact with the modules 1 and 2 and card 3 has excellent thermal conductivity, the thermal mass provided therein is added to that of the module thereby providing improved temperature stability.

Card 3 also adds structural stability to the modules, since card 3 is a rigid structure with excellent physical properties. The resulting assembly offers much vibration resistance, and the card may further be used as the mount for individual modules to a larger "motherboard."

Figure 2:
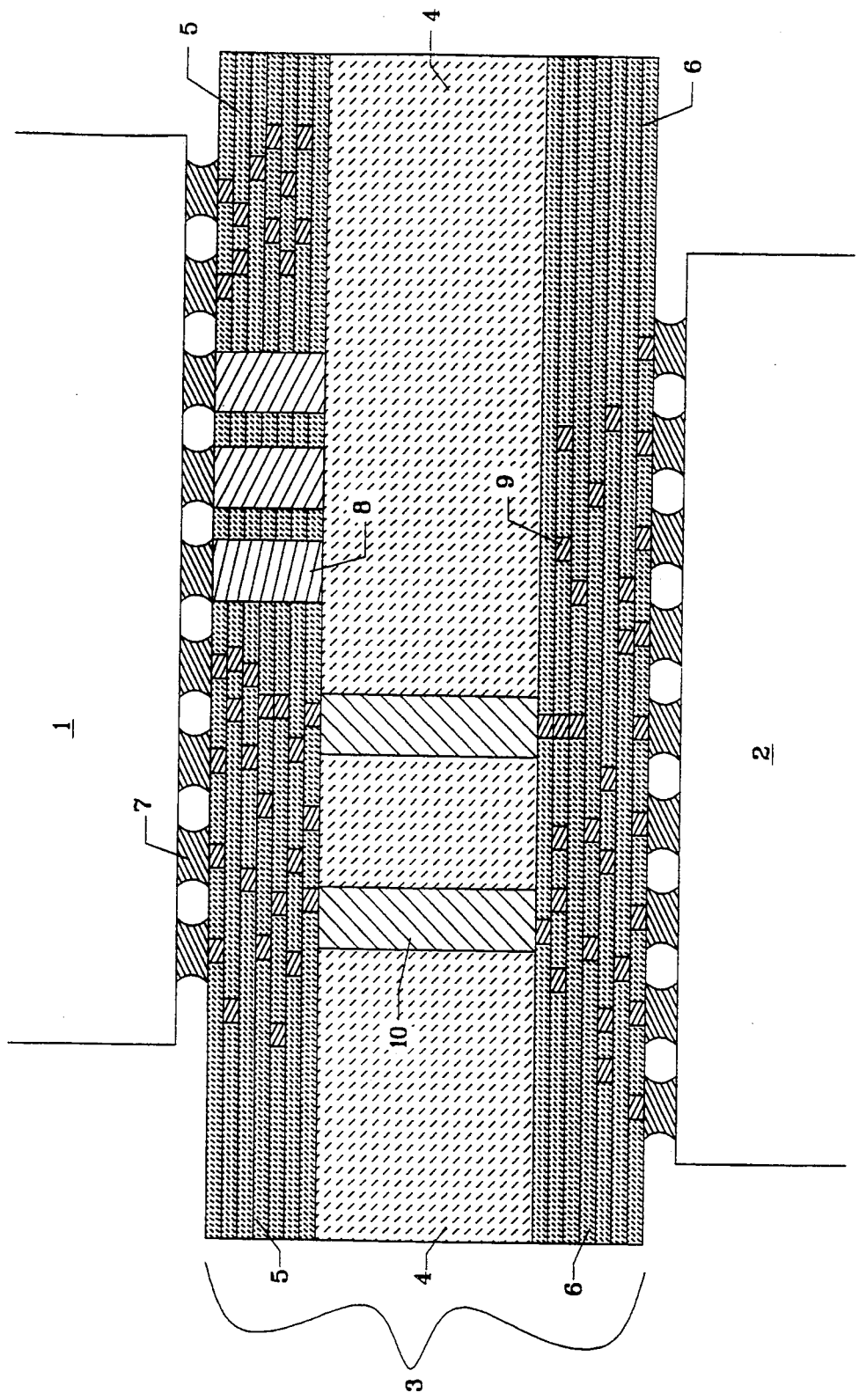
FIG. 2 illustrates a cross-section view of the preferred embodiment of the present invention taken along line 2' of FIG. 1.

FIG. 2 illustrates the circuit card 3 in detail by cross-section along line 2' of FIG. 1. The circuit card consists of two Low Temperature Cofired Ceramic (LTCC) multilayer structures 5 and 6 laminated to aluminum nitride core 4. The core 4 includes electrical core vias 10 to provide electrical connection between LTCC laminates 5 and 6. Core 4 is otherwise an electrical insulator.

Since LTCC is composed of a glass and ceramic mixture, the thermal conductivity of the LTCC material typically is less than desirable for multichip module applications. However, the addition of thermal vias 8 addresses this issue. Further, the relatively thin LTCC is not incapable of conducting thermal energy.

Aluminum nitride has a coefficient of thermal expansion very nearly identical to silicon. The LTCC material of the present invention is also reasonably matched. These two materials when combined in the way taught herein provide a good assemblage for bonding between similar low expansion multichip modules. In fact, these modules are often constructed of LTCC materials and may include thermal vias that may be interconnected to the thermal vias 8.

In practice, the LTCC is purchased in the form of a flexible tape or film, sometimes referred to as green tape. The tape is punched where either thermal or electrical vias are to be located, metallized including via filling, laminated into a multilayer structure as shown as 5 and 6 in FIG. 2, and then sintered to core 4. This sintering process may include or require the addition of pressure as is known in the art. Sintering generally takes place at very elevated temperatures.

Once circuit card 3 has been thusly formed, the card is ready for assembly together with modules 1 and 2 as illustrated for exemplary purposes in FIG. 1. Solder joints 7 are illustrated in FIG. 2 as the interconnection, though the invention is not limited thereto. Solder may be applied in a paste form. The modules 1 and 2 are then placed upon card 3 so as to correspond to the solder paste locations. Some misalignment is tolerated during reflow of the solder due to surface forces between the solder and adjoining metallization.

Heat sinks may then be attached as desired to card 3, or card 3 may be adapted for interconnection to other devices not shown. Other modules may be interconnected with additional cards similar to card 3.

While the foregoing details what is felt to be the preferred embodiment of the invention, no material limitations to the scope of the claimed invention are intended. Further, features and design alternatives that would be obvious to one of ordinary skill in the art are considered to be incorporated herein. The scope of the invention is set forth and particularly described in the claims hereinbelow.

I claim:

1. A multilayer circuit card connector for electrically interconnecting a first electronic module to a second electronic module comprising:
    a rigid nitride ceramic core of electrically insulative characteristic and thermally conductive characteristic with a thermal expansion characteristic similar to said first and second electronic modules;
    a first electrical via extending from a first surface of said core to a second surface of said core, said electrical via being electrically conductive;
    a first rigid laminate of a first electrically insulative oxide layer and a second electrically insulative oxide layer and a wiring pattern therebetween, said first rigid laminate bonded to said core on said first surface thereof, said first rigid laminate further comprising a first laminate electrical via electrically coupling between a first laminate surface opposite said core and said first electrical via;
    a second rigid laminate of a first electrically insulative oxide layer and a second electrically insulative oxide layer and a wiring pattern therebetween, said second rigid laminate bonded to said core on said second surface thereof, said second rigid laminate further comprising second laminate electrical vias electrically coupling between a first laminate surface of said second rigid laminate opposite said core and said first electrical via; and
    means for thermally and electrically connecting said first electronic module to said first rigid laminate and means for thermally and electrically connecting said second electronic module to said second rigid laminate, whereby said first and said second electronic modules are electrically interconnected.

2. The multilayer circuit card connector of claim 1 wherein said first rigid laminate and said second rigid laminate are sintered to said core.

3. The multilayer circuit card connector of claim 1 wherein said first rigid laminate comprises an LTCC material.

4. The multilayer circuit card connector of claim 1 further comprising a thermal via extending from said first rigid laminate surface to said core.

5. The multilayer circuit card connector of claim 1 wherein said core comprises aluminum nitride.

6. The multilayer circuit card connector of claim 5 wherein said first and said second rigid laminates comprise a glass and ceramic composition.

* * * * *